(12) United States Patent
Saari et al.

(10) Patent No.: US 10,732,041 B2
(45) Date of Patent: Aug. 4, 2020

(54) MICROELECTROMECHANICAL (MEMS) FABRY-PEROT INTERFEROMETER, APPARATUS AND METHOD FOR MANUFACTURING FABRY-PEROT INTERFEROMETER

(71) Applicant: TEKNOLOGIAN TUTKIMUSKESKUS VTT OY, Espoo (FI)

(72) Inventors: Heikki Saari, VTT (FI); Bin Guo, VTT (FI); Anna Rissanen, VTT (FI)

(73) Assignee: TEKNOLOGIAN TUTKIMUSKESKUS VTT OY, Espoo (FI)

( * ) Notice: Subject to any disclaimer, the term of this patent is extended or adjusted under 35 U.S.C. 154(b) by 0 days.

(21) Appl. No.: 16/721,975

(22) Filed: Dec. 20, 2019

(65) Prior Publication Data

US 2020/0124475 A1 Apr. 23, 2020

Related U.S. Application Data

(63) Continuation of application No. PCT/FI2018/050520, filed on Jun. 29, 2018.

(30) Foreign Application Priority Data

Jul. 3, 2017 (FI) ...................................... 20175641

(51) Int. Cl.
*G01J 3/26* (2006.01)
*G02B 26/00* (2006.01)
(Continued)

(52) U.S. Cl.
CPC .............. *G01J 3/26* (2013.01); *B81B 3/0083* (2013.01); *G02B 26/001* (2013.01); *B81B 2201/042* (2013.01); *B81C 1/00317* (2013.01)

(58) Field of Classification Search
CPC . G01J 3/26; G02B 5/28; G02B 26/001; B81B 3/0083; B81B 2201/042; B81C 1/00317
See application file for complete search history.

(56) References Cited

U.S. PATENT DOCUMENTS 5,142,414 A 8/1992 Koehler
5,381,232 A 1/1995 van Wijk
(Continued)

FOREIGN PATENT DOCUMENTS

EP 1126256 A2 8/2001
EP 3018521 A1 5/2016
(Continued)

OTHER PUBLICATIONS

Mannila et al, "Gas detection with microelectromechanical Fabry-Perot interferometer technology in cell phone," Proc. SPIE 9482, Next-Generation Spectroscopic Technologies VIII, 94820P (Jun. 3, 2015); doi:10.1117/12.2176923 Event: SPIE Sensing Technology +Applications, 2015, Baltimore, Maryland, United States.
(Continued)

*Primary Examiner* — Michael A Lyons
(74) *Attorney, Agent, or Firm* — Robert P. Michal, Esq.; Carter, DeLuca & Farrell LLP (57) ABSTRACT

A microelectromechanical (MEMS) Fabry-Perot interferometer includes a transparent substrate; a first metallic mirror structure on the transparent substrate, including a first metal layer and a first support layer; a second metallic mirror structure above the first metallic mirror structure on an opposite side of the first metallic mirror structure in view of the transparent substrate, the second metallic mirror structure including a second metal layer and a second support layer, wherein the first and the second support layer are parallel and including at least one of aluminum oxide or titanium dioxide; a Fabry-Perot cavity between the first and the second support layer, whereby the Fabry-Perot cavity is formed by providing an insulation layer on the first mirror structure, and at least partially removing the insulation layer after providing the second mirror structure; and electrodes for providing electrical contacts to the first and the second metal layer.

13 Claims, 3 Drawing Sheets

(51) Int. Cl.
*B81B 3/00* (2006.01)
*B81C 1/00* (2006.01)

(56) References Cited

U.S. PATENT DOCUMENTS

| | | | |
|---|---|---|---|
| 6,295,130 | B1 | 9/2001 | Sun et al. |
| 2001/0003487 | A1 | 6/2001 | Miles |
| 2003/0116711 | A1* | 6/2003 | Hara ................... G01J 3/26 250/338.1 |
| 2005/0167597 | A1 | 8/2005 | Yokura et al. |
| 2007/0177245 | A1 | 8/2007 | Kyoung |
| 2007/0242358 | A1 | 10/2007 | Lin et al. |
| 2008/0088911 | A1 | 4/2008 | Miles |
| 2011/0279824 | A1* | 11/2011 | Blomberg ............ G02B 26/001 356/519 |
| 2012/0050751 | A1* | 3/2012 | Blomberg ............ B81B 3/0013 356/519 |
| 2012/0120495 | A1 | 5/2012 | Kitahara et al. |
| 2012/0188646 | A1 | 7/2012 | Sano et al. |
| 2012/0212823 | A1 | 8/2012 | Funamoto et al. |
| 2013/0271839 | A1 | 10/2013 | Nishimura et al. |
| 2015/0372203 | A1 | 12/2015 | Eibl et al. |
| 2016/0077260 | A1 | 3/2016 | Urushidani |

FOREIGN PATENT DOCUMENTS

| | | |
|---|---|---|
| JP | 2002174721 A | 6/2002 |
| JP | 2012528345 A | 11/2012 |
| JP | 2014052594 A | 3/2014 |
| JP | 2015011311 A | 1/2015 |
| WO | 2010136654 A1 | 12/2010 |
| WO | 2013167811 A1 | 11/2013 |

OTHER PUBLICATIONS

A. Rissanen et al., "Largeaperture MOEMS Fabry-Perot interferometer for miniaturized spectral imagers," Proc. SPIE 9375, MOEMS and Miniaturized Systems XIV, 93750J (Feb. 27, 2015); doi: 10.1117/12.2075308 Event: SPIE OPTO, 2015, San Francisco, California, United States.

Gupta et al, "Microelectromechanical systems-based visible-near infrared Fabry-Perot tunable filters using quartz substrate", Optical Engineering 51(7), 074007 (Jul. 2012).

Rissanen et al, "MEMS FPI-based smartphone hyperspectral imager," Proc. SPIE 9855, Next-Generation Spectroscopic Technologies IX, 985507 (May 12, 2016); doi: 10.1117/12.2229575 Event: SPIE Commercial +Scientific Sensing and Imagin, 2016, Baltimore, Maryland, United States.

Hao Guo et al, "High-performance GaN-based lightemitting diodes on patterned sapphire substrate with a novel hybrid AG mirror and atomic layer deposition-TiO2/Al2O3 distributed Bragg reflector backside reflector" Optical Engineering 52(6), 063402 (Jun. 2013).

International Search Report issued by the Finnish Patent and Registration Office acting as the International Searching Authority in relation to International Application No. PCT/FI2018/0505520 dated Oct. 12, 2018 (12 pages).

Written Opinion of the International Searching Authority issued by the Finnish Patent and Registration Office acting as the International Searching Authority in relation to International Application No. PCT/FI2018/050520 dated Oct. 12, 2018 (9 pages).

Communication of Accpetance under Section 29a of Patents Decree issued by the Finnish Patent and Registration Office acting as in relation to Finnish Application No. 20175641 dated Mar. 29, 2018 (5 pages).

Decision—Application Accepted issued by the Finnish Patent and Registration Office acting as in relation to Finnish Application No. 20175641 dated Sep. 30, 2019 (1 page).

Finnish Search Report issued by the Finnish Patent and Registration Office in Relation to Finnish Application No. 20175641 dated Nov. 6, 2017 (2 pages).

Office Action issued by the Finnish Patent and Registration Office in relation to Finnish Application No. 20175641 dated Nov. 6, 2017 (8 pages).

Extended European Search Report issued by the European Patent Office in relation to European Application No. 18828785.8 dated May 19, 2020 (11 pages).

Notification of Ground of Rejection issued by the Japanese Patent Office in relation to Japanese Application No. 2019-571313 dated Jun. 19, 2020 (3 pages) along with English language translation (4 pages).

* cited by examiner

MICROELECTROMECHANICAL (MEMS) FABRY-PEROT INTERFEROMETER, APPARATUS AND METHOD FOR MANUFACTURING FABRY-PEROT INTERFEROMETER

CROSS-REFERENCE TO RELATED APPLICATIONS

This application is a continuation of PCT International Application No. PCT/FI2018/050520 filed Jun. 29, 2018, which claims priority to Finnish Patent Application No. 20175641, filed Jul. 3, 2017, the disclosure of each of these applications is expressly incorporated herein by reference in their entirety.

TECHNICAL FIELD

The present application generally relates to a semiconductor apparatus. In particular, but not exclusively, the present application relates to a Fabry-Perot interferometer (FPI), a method for producing a Fabry-Perot interferometer (FPI), and an apparatus. More specifically, the present application relates to electrically tunable Fabry-Perot interferometers (FPI) that are produced with microelectromechanical (MEMS) technology.

BACKGROUND

This section illustrates useful background information without admission of any technique described herein being representative of the state of the art.

Fabry-Perot interferometers (FPI) are typically used as optical filters and in spectroscopic sensors, for example. The Fabry-Perot interferometer (FPI) is based on parallel mirrors, wherein a (Fabry-Perot) cavity is formed into a gap between the mirrors.

The pass band wavelength of a Fabry-Perot interferometer (FPI) can be controlled by adjusting the distance between the mirrors i.e. the width of the gap. The tuning is usually made electrically.

Microelectromechanical technology may be used for producing electrically tunable Fabry-Perot interferometers (FPI). Prior art structure of a microelectromechanical interferometer usually includes layers of silicon, wherein electrically conductive layers and reflective layers are doped. A movable mirror is provided by removing a sacrificial layer of silicon dioxide, which layer has initially been formed between two mirror layers. The position of a movable mirror is controlled by applying voltage to electrodes, which are included in the mirror structures.

The microelectromechanical production technology allows series production of interferometers. However, there are some disadvantages related with the prior art solutions for production of interferometers and the interferometer components.

Known solutions utilize silver-coated mirrors within Fabry-Perot interferometers (FPI). Also, the cutting, encapsulating and transportation of the interferometers require special handling because of the movable, released mirror. A released mirror is sensitive to environmental stress, such as physical pressure, changes of temperature or humidity, contamination, etc.

Due to the relatively high production cost of interferometers, it has not been possible to use them in mass product applications where the cost requirements are strict.

A further disadvantage of the known solutions relates to the inability to provide a gap with short distance between the mirrors. This is due to wet etching process where providing narrow gaps is difficult. Also, when Fabry-Perot interferometers (FPI) are produced for visible and ultraviolet light, the optical layers need to be thin. Thin membranes are often discontinuous and include pinholes. Such membranes easily become damaged during wet etching. Therefore the prior art technology is not suitable for producing electrically tunable Fabry-Perot interferometers (FPI) for short wavelengths such as visible and ultraviolet range.

It is the aim of the current invention to provide a method and apparatus that mitigates for example the above problem of the state of the art.

SUMMARY

Various aspects of examples of the invention are set out in the claims.

According to a first example aspect of the present invention, there is provided a microelectromechanical (MEMS) Fabry-Perot interferometer, comprising:

a transparent substrate;

a first metallic mirror structure on the transparent substrate, comprising a first metal layer and a first support layer;

a second metallic mirror structure above the first metallic mirror structure on opposite side of the first metallic mirror structure in view of the transparent substrate, the second metallic mirror structure comprising a second metal layer and a second support layer, wherein the first and the second support layer are parallel and comprising at least one of aluminum oxide or titanium dioxide;

a Fabry-Perot cavity between the first and the second support layer, whereby the Fabry-Perot cavity is formed by providing an insulation layer on the first mirror structure, and at least partially removing the insulation layer after providing the second mirror structure; and electrodes for providing electrical contacts to the first and the second metal layer.

In an embodiment, the microelectromechanical (MEMS) Fabry-Perot interferometer further comprises:

a first aluminum oxide layer arranged below the transparent substrate; and a second aluminum oxide layer arranged above the transparent substrate, wherein the second aluminum oxide layer being part of the first support layer of the first metallic mirror structure.

In an embodiment, the microelectromechanical (MEMS) Fabry-Perot interferometer further comprises:

a lower insulation layer arranged below the first aluminum oxide layer, wherein the lower insulation layer comprising tetraethyl orthosilicate.

In an embodiment, the first metal layer of the first metallic mirror structure is arranged above the second aluminum oxide layer.

In an embodiment, the microelectromechanical (MEMS) Fabry-Perot interferometer further comprises:

a third aluminum oxide layer arranged above the first metal layer, wherein the third aluminum oxide layer being part of the first support layer of the first metallic mirror structure.

In an embodiment, the microelectromechanical (MEMS) Fabry-Perot interferometer further comprises:

a first electric contact arranged to connect with the first metal layer (121), wherein a portion of the third aluminum oxide layer is removed between the first electric contact and the first metal layer by wet etching.

In an embodiment, the microelectromechanical (MEMS) Fabry-Perot interferometer further comprises:

the insulation layer arranged above the third aluminum oxide layer, wherein the insulation layer comprising tetraethyl orthosilicate.

In an embodiment, the microelectromechanical (MEMS) Fabry-Perot interferometer further comprises:

a fourth aluminum oxide layer arranged above the insulation layer, wherein the fourth aluminum oxide layer being part of the second support layer of the second metallic mirror structure.

In an embodiment, the second metal layer of the second metallic mirror structure is arranged above the fourth aluminum oxide layer.

In an embodiment, the microelectromechanical (MEMS) Fabry-Perot interferometer further comprises:

a fifth aluminum oxide layer arranged above the second metal layer, wherein the fifth aluminum oxide layer being part of the second support layer of the second metallic mirror structure.

In an embodiment, the microelectromechanical (MEMS) Fabry-Perot interferometer further comprises:

a second electric contact arranged to connect with the second metal layer, wherein a portion of the fifth aluminum oxide layer is removed between the second electric contact and the second metal layer by wet etching.

In an embodiment, the second metallic mirror structure comprises through-holes for removing at least part of the insulation layer to provide a tunable Fabry-Perot cavity between the first and the second metallic mirror structure.

In an embodiment, the transparent substrate comprises fused quartz glass or fused silica glass; the aluminum oxide comprises $Al_2O_3$; and the titanium dioxide comprises $TiO_2$.

In an embodiment, at least one layer comprises an Atomic Layer Deposition (ALD) grown aluminum oxide layer or a plasma enhanced chemical vapor deposition (PECVD) layer.

According to a second example aspect of the present invention, there is provided a semiconductor apparatus comprising a Fabry-Perot interferometer of the first aspect.

According to a third example aspect of the present invention, there is provided a method for manufacturing a microelectromechanical (MEMS) Fabry-Perot interferometer, comprising:

providing a transparent substrate;

depositing a first metallic mirror structure on the transparent substrate, comprising a first metal layer and a first support layer;

depositing a second metallic mirror structure above the first metallic mirror structure on opposite side of the first metallic mirror structure in view of the transparent substrate, the second metallic mirror structure comprising a second metal layer and a second support layer, wherein the first and the second support layer are parallel and comprising at least one of aluminum oxide or titanium dioxide;

forming a Fabry-Perot cavity between the first and the second support layer, whereby the cavity is formed by providing an insulation layer on the first metallic mirror structure, and at least partially removing the insulation layer after providing the second metallic mirror structure; and forming electrodes for providing electrical contacts to the first and the second metal layer.

Different non-binding example aspects and embodiments of the present invention have been illustrated in the foregoing. The embodiments in the foregoing are used merely to explain selected aspects or steps that may be utilized in implementations of the present invention. Some embodiments may be presented only with reference to certain example aspects of the invention. It should be appreciated that corresponding embodiments may apply to other example aspects as well.

BRIEF DESCRIPTION OF THE DRAWINGS

For a more complete understanding of example embodiments of the present invention, reference is now made to the following descriptions taken in connection with the accompanying drawings in which.

DETAILED DESCRIPTION OF THE DRAWINGS

In embodiments, it is disclosed microelectromechanical (MEMS) Fabry-Perot interferometer. The microelectromechanical (MEMS) Fabry-Perot interferometer technology can also be used within an integration platform for multichip modules technology with hybrid integrated active circuits, for example.

The microelectromechanical (MEMS) Fabry-Perot interferometer technology can be manufactured to any transparent substrate that is suitable for thin film processing in clean rooms. Fused silica, or quartz is typically used for MEMS applications due to their good properties.

Fused quartz and fused silica are the amorphous form of quartz. Fused quartz is made from purifying and melting natural crystalline quartz, usually natural quartz sand. Fused silica is a purer version of fused quartz that is made from various silicon gasses. Chemically known as $SiO_2$, silica is "pure" glass. All other commercial glasses are $SiO_2$ with other dopants added to lower the melting temperature and modify optical, thermal and mechanical characteristics.

Transparent substrate of fused quartz or fused silica provide many advantages. Such substrate has extremely low coefficient of expansion, making it far more shock resistant than any other refractory material. It has better transmission characteristics of any standard glass: 220 nanometres to 3 microns for standard semiconductor-grade fused quartz, and 175 nanometres to 3 microns for many types of fused silica. It has highest temperature characteristics of any glass. A continuous maximum of 900 C to 1100 C, depending on the size and shape of the part and can be used up to 1400 C for short periods of time. Dielectric constant is very low and it has the lowest loss tangent of almost all known materials. Thermal conductivity is very low and it can be melted, bent, fused, drawn, welded into tube and rod forms, ground and polished. It is harder than most glasses and can be made into any shape and relatively large sizes and has excellent resistance to non-fluorinated acids, solvents and plasmas, and is excellent for containing many high-purity chemicals but still less expensive than sapphire for larger parts.

The present invention and its potential advantages are understood by referring to FIGS. 1 through 5 of the drawings. In this document, like reference signs denote like parts or steps.

Figure 1:
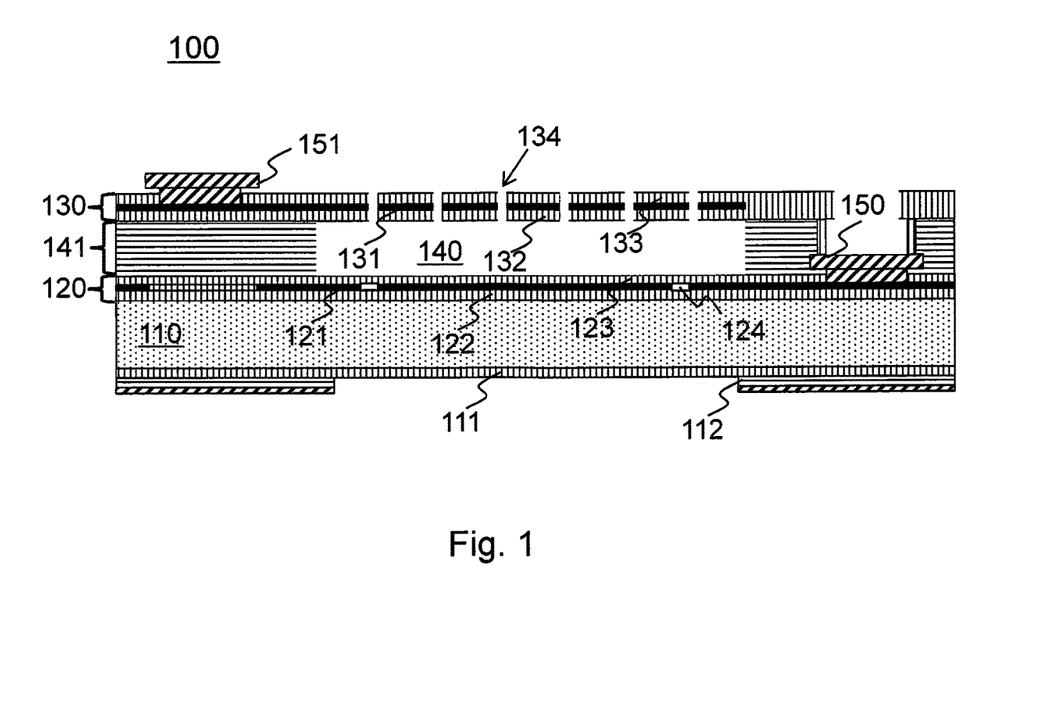
FIG. 1 illustrates a schematic view of a microelectromechanical system (MEMS) Fabry-Perot interferometer according to an embodiment of the invention.

FIG. 1 illustrates a schematic view of microelectromechanical (MEMS) Fabry-Perot interferometer 100 according to an embodiment of the invention.

A semiconductor apparatus may comprise the microelectromechanical (MEMS) Fabry-Perot interferometer 100 and further elements, such as a die (not shown) that may be coupled on top or below of the microelectromechanical (MEMS) Fabry-Perot interferometer 100. Furthermore, a circuit board (not shown) may be coupled on top or below of the microelectromechanical (MEMS) Fabry-Perot interferometer 100. A solder ball may be utilized for coupling.

The semiconductor apparatus may further comprise an integrated passive device (IPD) that may comprise a capacitor (e.g., decoupling capacitor), resistor or inductor in some implementations. The integrated passive device (IPD) may be arranged on a first surface (e.g., top surface) or a second surface of the semiconductor apparatus, for example.

The microelectromechanical (MEMS) Fabry-Perot interferometer 100 comprises a transparent substrate 110, a first metallic mirror structure 120, a second metallic mirror structure 130, a Fabry-Perot cavity 140 and electrodes 150-151.

The first metallic mirror structure 120 is arranged on the transparent substrate 110, comprising a first metal layer 121 and a first support layer 122-123.

The second metallic mirror structure 130 is arranged above the first metallic mirror structure 120 on opposite side (above in FIG. 1) of the first metallic mirror structure 120 in view of the transparent substrate 110 (below), the second metallic mirror structure 130 comprising a second metal layer 131 and a second support layer 132-133, wherein the first 122-123 and the second support layer 132-133 are substantially parallel and comprising at least one of aluminium oxide or titanium dioxide.

A Fabry-Perot cavity 140 is generated between the first 122-123 and the second support layer 132-133, whereby the Fabry-Perot cavity 140 is formed by providing an insulation layer 141 on the first mirror structure 120, and at least partially removing the insulation layer 141 after providing the second mirror structure 130. By forming such cavity 140, the second metallic mirror structure 130 becomes movable towards the first metallic mirror structure 120 through electrostatic actuation provided by drive electrodes.

At least two electrodes 150-151 are arranged for providing electrical contacts to the first 121 and the second metal layer 131.

A first aluminium oxide layer 111 may be arranged below the transparent substrate 110, and a second aluminium oxide layer 122 is arranged above the transparent substrate 110, wherein the second aluminium oxide layer 122 is part of the first support layer 122-123 of the first metallic mirror structure 120.

A lower insulation layer 112 may be arranged below the first aluminium oxide layer 111, wherein the lower insulation layer 112 comprises tetraethyl orthosilicate (TEOS).

In an embodiment, at least one insulation layer 112, 141 may comprise silicon dioxide made from tetraethyl orthosilicate (TEOS), for example.

The first metal layer 121 of the first metallic mirror structure 120 may be arranged above the second aluminium oxide layer 122.

A third aluminium oxide layer 123 may be arranged above the first metal layer 121, wherein the third aluminium oxide layer 123 is part of the first support layer 122-123 of the first metallic mirror structure 120.

A first electric contact 150 may be arranged to connect with the first metal layer 121, wherein a portion of the third aluminium oxide layer 123 is removed between the first electric contact 150 and the first metal layer 121 by wet etching, for example. Dry etching may also be used, for example when selectivity is enough.

The insulation layer 141 may be arranged above the third aluminium oxide layer 123, wherein the insulation layer 141 comprises tetraethyl orthosilicate (TEOS).

A fourth aluminium oxide layer 132 may be arranged above the insulation layer 140, wherein the fourth aluminium oxide layer 132 is part of the second support layer 132-133 of the second metallic mirror structure 130.

The second metal layer 131 of the second metallic mirror structure 130 may be arranged above the fourth aluminium oxide layer 132.

A fifth aluminium oxide layer 133 may be arranged above the second metal layer 131, wherein the fifth aluminium oxide layer 133 is part of the second support layer 132-133 of the second metallic mirror structure 130.

A second electric contact 151 may be arranged to connect with the second metal layer 131, wherein a portion of the fifth aluminium oxide layer 133 is removed between the second electric contact 151 and the second metal layer 131 by wet etching, for example.

The second metallic mirror structure 130 comprises through-holes 134 for removing at least part of the insulation layer 141 to provide the Fabry-Perot cavity 140 between the first 120 and the second metallic mirror structure 130.

In an embodiment, the Fabry-Perot cavity 140 is processed by removing a sacrificial oxide layer (portion of insulation layer 141) by HF vapour. Hydrofluoric acid (HF) is an ideal etchant for silicon oxide types used in micromachining, since it allows fast etch rates and is highly selective against silicon. HF etching may be used for the removal of sacrificial oxide layers in MEMS fabrication.

In an embodiment, the transparent substrate 110 comprises fused quartz glass or fused silica glass, the aluminium oxide comprises $Al_2O_3$ and the titanium dioxide comprises $TiO_2$, for example.

At least one of the support layers 122-123, 132-133 comprises $Al_2O_3$ or $TiO_2$ coated Fabry-Perot interferometer (FPI) mirrors.

Al2O3 coating may be deposited using ALD (Atomic Layer Deposition), for example.

$Al_2O_3$ may also be used as a protection layer for the metal layer 121, 131 during the fabrication process flow, for example against wet etch.

In an embodiment, the first 121 and second metal layer 131 may be patterned into certain shapes and/or multiple areas while such shapes/areas may form electrostatic actuation to at least one of the mirror structures 120, 130.

In an embodiment, the first metallic mirror structure 120 comprises at least one groove 124 to divide the first metal layer 121 into several areas that may form actuation/drive electrodes. By connecting such electrodes to certain DC or AC signal, the second mirror structure 130 can be pulled towards the first mirror structure 120.

In an embodiment, mirror functionality is provided by a metallic layer 121, 131. Furthermore, target is to provide a suspended metallic mirror structure 130 that forms a tunable Fabry-Perot interferometer 100 when combined with the bottom metal layer 121 and associated metallic mirror structure 120. Aluminium oxide layers may be arranged to support the metal layer(s) for such structure(s).

In an embodiment, the first metal layer 121 may be etched into certain shapes and/or multiple areas and may form grooves 124.

In an embodiment, the first second layer 131 may be etched into certain shapes and/or multiple areas and may form grooves and/or through-holes 134.

Figure 2:
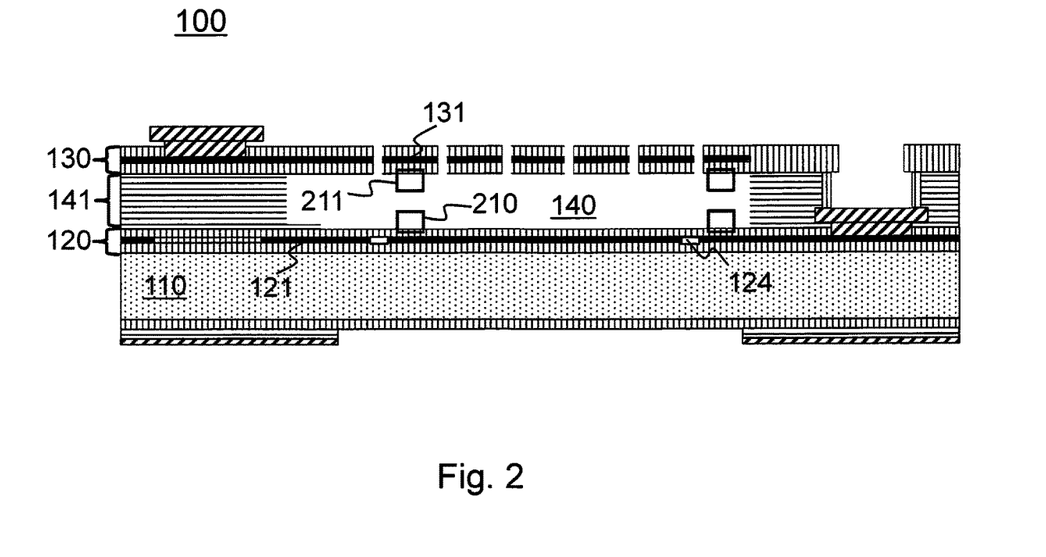
FIG. 2 illustrates another schematic view of a microelectromechanical system (MEMS) Fabry-Perot interferometer according to an embodiment of the invention.

FIG. 2 illustrates another schematic view of microelectromechanical (MEMS) Fabry-Perot interferometer 100 according to an embodiment of the invention.

In an embodiment, the microelectromechanical (MEMS) Fabry-Perot interferometer 100 further comprises an electrical control of at least one of the metallic mirror structures 120, 130. At least one of the metallic mirror structures 120, 130 may be utilized as a beam structure (e.g. second metallic mirror structure 130), in which both ends thereof are fixed to a fixed element of the microelectromechanical (MEMS) Fabry-Perot interferometer 100.

In an embodiment, the microelectromechanical (MEMS) Fabry-Perot interferometer 100 may further comprise at least one lower drive electrode 210 provided below the beam structure (e.g. second metallic mirror structure 130), and at least one upper drive electrode 211 provided on the lower surface of the beam structure (e.g. second metallic mirror structure 130), facing the substrate 110. Thus, when a potential difference is arranged between the upper drive electrode 211 and the lower drive electrode 210, the beam structure (e.g. second metallic mirror structure 130) is attracted towards the substrate 110 by an electrostatic attractive force, so that the distance between the metallic mirror structures 120, 130 is changed and properties of the microelectromechanical (MEMS) Fabry-Perot interferometer 100 are adjusted based on the control signal for the electrodes 210, 211.

In an embodiment, the drive electrodes 210, 211 may be integrated with metal layers 121, 131 of the metallic mirror structures 120, 130, respectively, to provide bias voltage for the potential difference.

Also, the Fabry-Perot cavity 140 (air gap) exists between the metallic mirror structures 120, 130 and also between the electrodes 210, 211.

In an embodiment, when a bias voltage (over drive electrodes or metal layers) is applied, at least one electrode may be thermally expanded and shifts in the direction of the cavity 140.

In an embodiment, when the bias voltage is applied, a second bias electrode 131, 211 may be charged positively resulting in a buildup of positive (+) charges, and a first bias electrode 121, 210 may be charged negatively resulting in a buildup of (−) charges. Meanwhile, the charge on the cavity 140 may be maintained at 0, independent of the application of a bias voltage. In practice, however, charge buildup often occurs to the cavity 140. Thus, the detected charge on the insulator within the 140 is not always 0.

In an embodiment, the metallic mirror structures 120, 130 are movable in relation to each other in alternative way. The bottom metal layer 121 of the metallic mirror structure 120 may be patterned (grooves 124) to form electrode areas (portions between grooves 124) that together with the patterned upper mirror electrode 131 areas can be used for electrostatic actuation of the upper mirror structure 130 either in DC or AC mode, for example.

Figure 3:
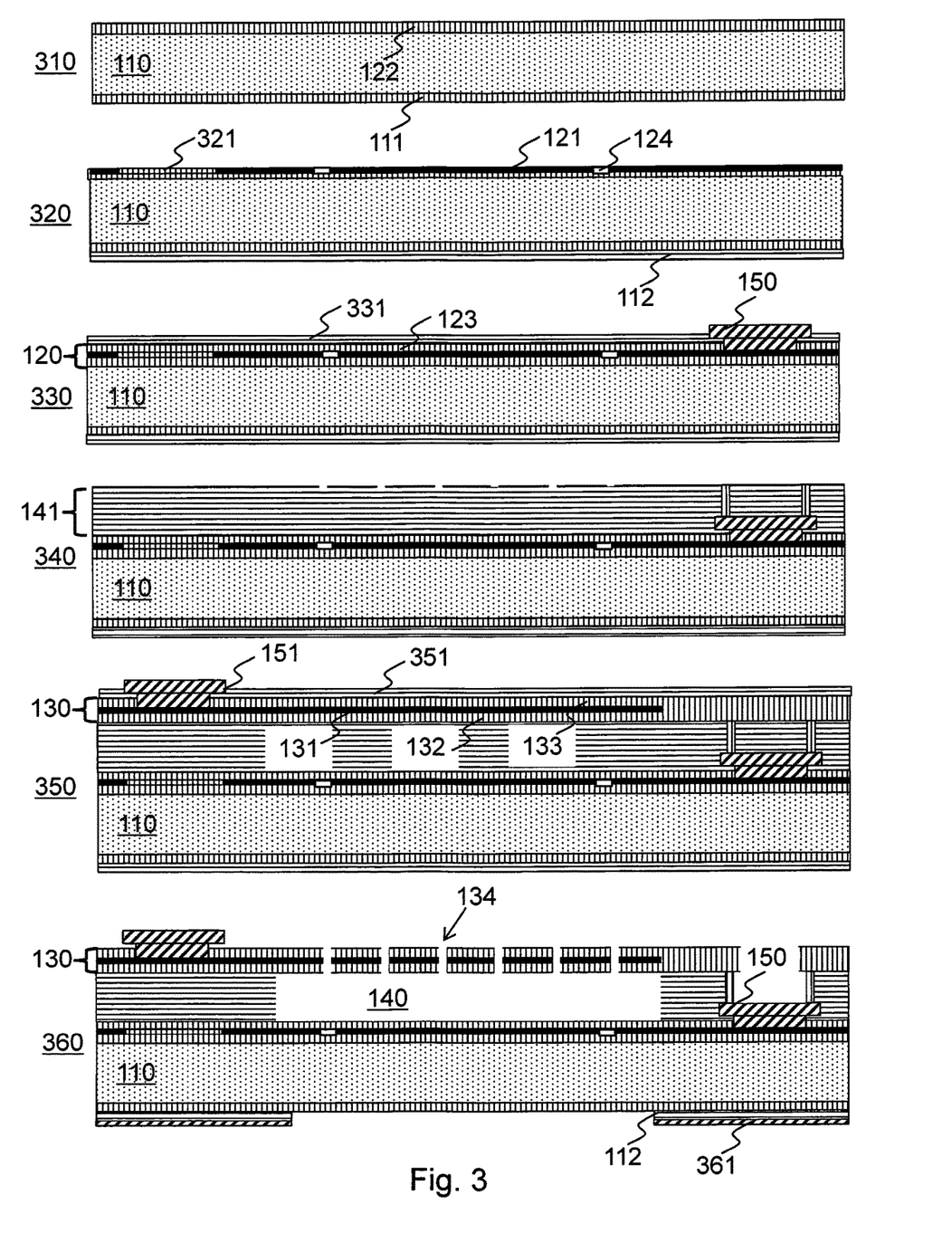
FIG. 3 shows exemplary production process phases of an electrically tunable Fabry-Perot interferometer (FPI) according to an embodiment of the invention.

FIG. 3 shows exemplary production process phases of an electrically tunable Fabry-Perot interferometer (FPI) according to an embodiment of the invention.

In phase 310, a transparent substrate 110, such as a quartz substrate, is provided and both upper and lower surfaces of the transparent substrate 110 are coated using aluminum oxide, such as $Al_2O_3$, to provide a first aluminum oxide layer 111 arranged below the transparent substrate 110 and a second aluminum oxide layer 122 arranged above the transparent substrate 110.

Thickness of the layers 111, 122 is typically a quarter or a half of the operating wavelength of the radiation within the material of the concerned layer. In this case the thickness of the layers 111, 122 may be 20 nm, for example. These layers 111, 122 can be deposited on the substrate 110 by an ALD (Atomic Layer Deposition) process, for example. The temperature of the ALD process can be e.g. 100-300° C. However, since the insulation layer (for the FPI cavity) of polymer has not yet been provided at this stage, it is also possible to use alternative processes that utilize higher temperatures.

In phase 320, a lower insulation layer 112 is arranged below the first aluminium oxide layer 111, wherein the lower insulation layer 112 comprises tetraethyl orthosilicate (TEOS). The lower insulation layer 112 may be deposited using ALD, for example. Thickness of the lower insulation layer 112 may be, for example, 50 nm. Furthermore, a first metal layer 121 is arranged on top of the second aluminum oxide layer 122. The first metal layer 121 may comprise Ag (silver), for example. The first metal layer 121 may be formed by using sputtering or evaporation of suitable metal, such as Ag, for example. The first metal layer 121 forms an electrode of a mirror of the FPI 100. The first metal layer 121 may be patterned and wet etched in order to remove the metal from the required location 321 outside the pattern. For example, the first metal layer 121 may be etched into certain shapes and/or multiple areas and may form grooves 124.

In phase 330, a third aluminium oxide layer 123 is arranged above the first metal layer 121, wherein the third aluminium oxide layer 123 is part of a first support layer 122-123 of the first metallic mirror structure 120. The layer 123 can be deposited by an ALD (Atomic Layer Deposition) process, for example. Thickness of the layer 123 may be 20 nm, for example.

An insulation layer 331 is arranged above the third aluminium oxide layer 123, wherein the insulation layer 331 comprises tetraethyl orthosilicate (TEOS). The insulation layer 331 may be deposited using ALD, for example. Thickness of the insulation layer 331 may be, for example, 50 nm.

Furthermore, a first electric contact 150 is arranged to connect with the first metal layer 121, wherein a portion of the third aluminium oxide layer 123 (and the insulation layer 331) is removed between the first electric contact 150 and the first metal layer 121 by wet etching, for example.

In phase 340, an insulation layer 141 is arranged above the third aluminium oxide layer 123 (and the insulation layer 331), wherein the insulation layer 141 comprises tetraethyl orthosilicate (TEOS), for example. The insulation layer 141 can be deposited by an ALD (Atomic Layer Deposition) process, for example. Thickness of the layer 141 may be 1450 nm, for example.

Furthermore, the insulation layer 141 may be etched using Oxide Etching, for example STS AOE (Advanced Oxide Etch) above the first electric contact 150.

In phase 350, a fourth aluminium oxide layer 132 is arranged above the insulation layer 141. The fourth aluminium oxide layer 132 can be deposited by an ALD (Atomic Layer Deposition) process, for example. Thickness of the layer 132 may be 70 nm, for example.

Furthermore, a second metal layer 131 is arranged above the fourth aluminium oxide layer 132, and a fifth aluminium oxide layer 133 is arranged above the second metal layer 131, wherein the fourth aluminium oxide layer 132 and the fifth aluminium oxide layer 133 being part of the second support layer 132-133 of the second metallic mirror structure 130.

The second metal layer 131 may comprise Ag (silver), for example. The second metal layer 131 may be formed by using sputtering or evaporation of suitable metal, such as Ag, for example. The second metal layer 131 forms an electrode of a mirror of the FPI 100. The second metal layer 131 may be patterned and wet etched in order to remove the metal from the required location outside the pattern.

The fourth and fifth aluminium oxide layer 132-133 can be deposited by an ALD (Atomic Layer Deposition) process, for example. Thickness of each layer 132, 133 may be 70 nm, for example. Above the fifth aluminium oxide layer 133 a further insulation layer insulation layer 351 may be arranged, wherein the further insulation layer comprises tetraethyl orthosilicate (TEOS), for example. The further insulation layer 351 can be deposited by an ALD (Atomic Layer Deposition) process, for example. Thickness of the further insulation layer 351 may be 50 nm, for example.

Furthermore, a second electric contact 151 is arranged to connect with the second metal layer 131, wherein a portion of the fifth aluminium oxide layer 133 (and the further insulation layer 351) is removed between the second electric contact 151 and the second metal layer 131 by wet etching, for example.

The second electric contact 151 may comprise aluminium with thickness of 500 nm, for example.

In phase 360, the second metallic mirror structure 130 is processed to provide through-holes 134 for removing at least part of the insulation layer 141 to provide the Fabry-Perot cavity 140 between the first 120 and the second metallic mirror structure 130. Patterning and etching can be used for providing the through-holes 134 in the second metallic mirror structure 130. These holes are needed for removing a portion of the insulation layer 141. Furthermore, the insulation layer 141 and the second support layer 132-133 may be etched using Oxide Etching, for example STS AOE (Advanced Oxide Etch) above the first electric contact 150. Plasma etching may be used to process through-holes 134 to the second metallic mirror structure 130.

Furthermore, backside lithography is performed as well as wet etching, the front side being protected by photoresist (PR). Portion of the lower insulation layer 112 is removed and metal layer elements 361 (of aluminium, for example) are arranged below the lower insulation layer 112. By removing the portion of the lower insulation layer 112, an aperture is provided. The aperture may be used for passing light to the FPI 100, for example.

In an embodiment, deposition of at least one layer may be utilized using PECVD silane process/oxidation, for example.

In an embodiment, at least one barrier layer may be formed to a metal layer element extending on a surface of the at least one metal layer.

The barrier layer may comprise a low-pressure chemical vapor deposition nitride (LPCVD SiN) or a plasma enhanced chemical vapor deposition nitride (PECVD SiN).

At least one insulation layer of the semiconductor apparatus may comprise a plasma enhanced chemical vapor deposition (PECVD) layer, such as tetraethylorthosilicate (TEOS).

Figure 4:
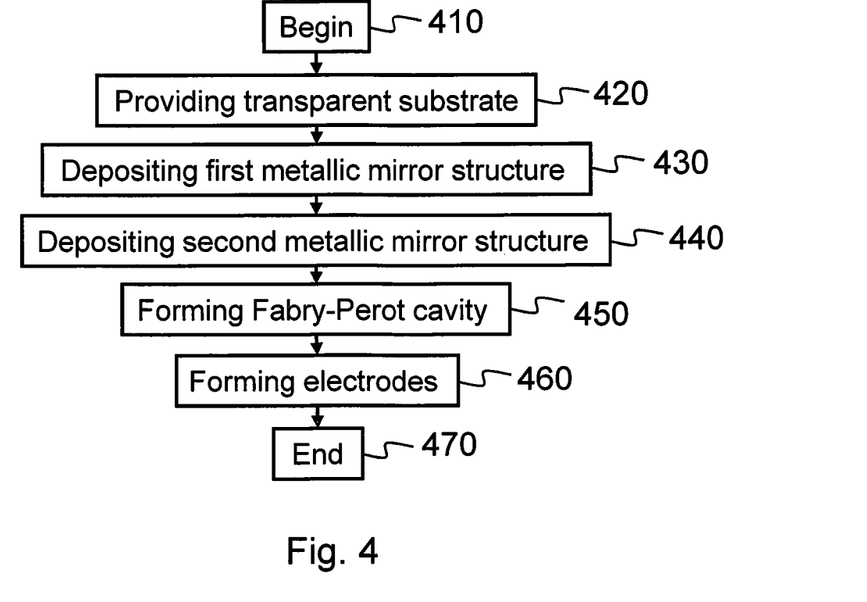
FIG. 4 shows a flow chart of a method according to an embodiment of the invention.

FIG. 4 shows a flow chart of a method according to an embodiment of the invention.

A method for manufacturing a microelectromechanical (MEMS) Fabry-Perot interferometer is started in step 410.

In step 420, a transparent substrate is provided. This step may comprise, for example, bringing the substrate into the reaction space of a typical reactor tool, e.g. a tool suitable for carrying out an ALD-type process.

In step 430, a first metallic mirror structure is deposited on the transparent substrate, comprising a first metal layer and a first support layer.

In step 440, a second metallic mirror structure is deposited above the first metallic mirror structure on opposite side of the first metallic mirror structure in view of the transparent substrate, the second metallic mirror structure comprising a second metal layer and a second support layer, wherein the first and the second support layer are parallel and comprising at least one of aluminum oxide or titanium dioxide.

In step 450, a Fabry-Perot cavity is formed between the first and the second support layer, whereby the cavity is formed by providing an insulation layer on the first metallic mirror structure, and at least partially removing the insulation layer after providing the second metallic mirror structure.

In step 460, electrodes are formed for providing electrical contacts to the first and the second metal layer.

In step 470, method ends.

The above method steps may be carried in different order than presented and further steps may be carried out between the steps of FIG. 4.

In an embodiment, a passivating layer that comprises aluminium oxide may be formed on a surface of a substrate to protect from effects caused by chemical interaction between the passivating layer and a conducting electrode by fabricating a barrier layer between the passivating layer and the conducting electrode.

A barrier layer comprising titanium and oxygen, tantalum and oxygen, zirconium and oxygen, hafnium and oxygen, or a combination of any of these, or a combination of any of these with aluminium and oxygen, on the passivating layer may be deposited by exposing the passivating layer in a reaction space to alternately repeated surface reactions of two or more different precursors, wherein at least one of the precursors is a precursor for oxygen, and forming the conducting electrode on the barrier layer deposited on the passivating layer by making a layer comprising aluminium paste on the barrier layer.

The reaction space may be subsequently pumped down to a pressure suitable for forming the passivating layer comprising aluminium oxide. The reaction space can be pumped down to the suitable pressure using e.g. a mechanical vacuum pump or, in the case of atmospheric pressure ALD systems and/or processes, gas flows can be set to protect the deposition zone from the atmosphere. The substrate may be also heated to a temperature suitable for forming the passivating layer by the used method. The substrate can be introduced to the reaction space through e.g. an airtight load-lock system or simply through a loading hatch. The substrate can be heated by e.g. resistive heating elements that also heat the entire reaction space.

After the substrate and the reaction space have reached the targeted temperature and other conditions suitable for deposition, the silicon surface can be conditioned such that the passivating deposit may be essentially directly deposited on the surface. This conditioning of the surface on which the passivating layer is to be deposited can include chemical purification of the surface of the film from impurities and/or oxidation. Especially removal of oxide is beneficial when the silicon surface has been imported into the reaction space via an oxidizing environment, e.g. when transporting the exposed surface from one deposition tool to another. The details of the process for removing impurities and/or oxide from the surface of the silicon film will be obvious to the skilled person in view of this specification. In some embodiments of the invention the conditioning can be done ex-situ, i.e. outside the tool suitable for ALD-type processes.

After the substrate has been conditioned, an alternate exposure of the deposition surface to different precursor chemicals may be started, to form the passivating layer (comprising e.g. aluminium oxide) directly on the silicon substrate. Each exposure of the deposition surface to a precursor results in the formation of additional deposit on the deposition surface, as a result of adsorption reactions of the corresponding precursor with the deposition surface.

A typical reactor suitable for ALD-type deposition comprises a system for introducing carrier gas, such as nitrogen or argon into the reaction space such that the reaction space can be purged from surplus chemical and reaction byproducts before introducing the next precursor chemical into the reaction space. This feature together with the controlled dosing of vaporized precursors enables alternately exposing the substrate surface to precursors without significant intermixing of different precursors in the reaction space or in other parts of the reactor. In practice the flow of carrier gas is commonly continuous through the reaction space throughout the deposition process and only the various precursors are alternately introduced to the reaction space with the carrier gas.

Thickness of the passivating layer on the substrate can be controlled by the number of exposures of the deposition surface to the different precursors. The thickness of the passivating layer is increased until a targeted thickness is reached, after which the at least one insulator layer is deposited.

Deposition of the insulation layer, in one embodiment of the invention, is carried out in an ALD-type process in the same deposition tool directly after the deposition of the passivating layer has ended. In this case deposition of the insulator layer can begin simply by changing the precursor chemicals from those used for the deposition of the passivating layer to those suitable for the deposition of the insulator layer.

In an embodiment, a semiconductor apparatus comprises a bond wire package including a microelectromechanical (MEMS) Fabry-Perot interferometer stacked on a die. The die may be disposed on a leadframe. The leadframe may be a pin grid array (PGA) package, a quad flat non-leaded (QFN) package or other package. The leadframe may comprise first pads and may be mounted on a PCB. An intermediate layer may be disposed between the microelectromechanical (MEMS) Fabry-Perot interferometer and the die and connect the microelectromechanical (MEMS) Fabry-Perot interferometer to the die. The microelectromechanical (MEMS) Fabry-Perot interferometer, the die, and the intermediate layer may replace the microelectromechanical (MEMS) Fabry-Perot interferometer and die.

In an embodiment, metallization layers may include passive devices, portions of passive devices, and/or interconnect devices (e.g., couplers, jumpers, traces, etc.).

The microelectromechanical (MEMS) Fabry-Perot interferometer may include an insulation layer or a second substrate, and the metallization layers. The insulation layer or the second substrate is disposed between the metallization layers. The insulation layer or the second substrate may include vias. The vias may be through glass vias (TGVs) or through silicon vias (TSVs).

Additional pads may be disposed on the microelectromechanical (MEMS) Fabry-Perot interferometer. The pads may be connected to the first pads by bond wires. The pads may be connected to the metallization layer and/or passive devices in the metallization layer, for example.

A microelectromechanical (MEMS) Fabry-Perot interferometer (FPI) 100 chip, as disclosed, may cover larger wavelength range than dielectric mirror MEMS-FPIs. Typically, dielectric mirror MEMS-FPI can be tuned in the wavelength range±10 . . . 15% around the design wavelength. Outside the operational wavelength range the dielectric mirror MEMS-FPI has high transmission. However, the metallic mirror of the microelectromechanical (MEMS) Fabry-Perot interferometer (FPI) 100 transmits only spectral bands for which the FPI air gap 140 corresponds to a constructive interference. This is why it can be used in wide spectral range hyperspectral imagers based on RGB type image sensor, for example.

Figure 5:
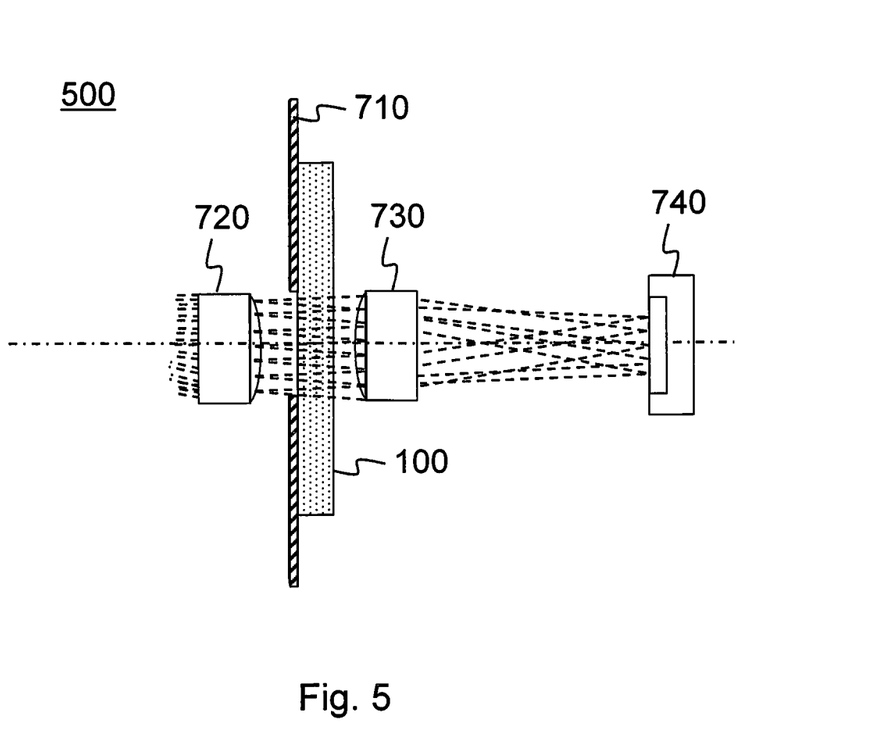
FIG. 5 illustrates another schematic view of an apparatus comprising a microelectromechanical system (MEMS) Fabry-Perot interferometer according to an embodiment of the invention.

FIG. 5 illustrates another schematic view of an apparatus 500 comprising a microelectromechanical system (MEMS) Fabry-Perot interferometer (FPI) 100 according to an embodiment of the invention.

The apparatus 500 may comprise, for example a hyperspectral imager.

In an embodiment, the hyperspectral imager 500 comprises a microelectromechanical (MEMS) Fabry-Perot interferometer (FPI) 100, as shown. The microelectromechanical (MEMS) Fabry-Perot interferometer (FPI) 100 is arranged on a supporting plate 710 that comprises an aperture for light, for example. See, for example, FIGS. 1-3 for generating the aperture.

In an embodiment, the microelectromechanical system (MEMS) Fabry-Perot interferometer (FPI) chip 100 is placed in between two wafer level optics lenses 720-730. A first lens 720 (wafer level imaging lens) collimates the light entering the FPI 100 and the second lens 730 (wafer level focusing lens) focuses an image of a target to an image sensor 740. Thus it is possible to build a very compact hyperspectral imager 500 within a cubic centimeter dimension.

Without in any way limiting the scope, interpretation, or application of the claims appearing below, a technical effect of one or more of the example embodiments disclosed herein is an improved performance of a microelectromechanical (MEMS) Fabry-Perot interferometer. Another technical effect of one or more of the example embodiments disclosed herein is an improved fabrication process of a microelectromechanical (MEMS) Fabry-Perot interferometer. Another technical effect of one or more of the example embodiments disclosed herein is the provision of a reliable and compact semiconductor apparatus. Still another technical effect of one or more of the example embodiments disclosed herein is limited size of the microelectromechanical (MEMS) Fabry-Perot interferometer with a wide variety of operating wavelengths.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the foregoing describes example embodiments of the invention, these descriptions should not be viewed in a limiting sense. Rather, there are several variations and modifications that may be made without departing from the scope of the present invention as defined in the appended claims.

The invention claimed is:

1. A microelectromechanical (MEMS) Fabry-Perot interferometer, comprising:
   a transparent substrate;
   a first metallic mirror structure on the transparent substrate, comprising a first metal layer and a first support layer;
   a second metallic mirror structure above the first metallic mirror structure on opposite side of the first metallic mirror structure in view of the transparent substrate, the second metallic mirror structure comprising a second metal layer and a second support layer, wherein the first and the second support layer are parallel and comprising at least one of aluminum oxide or titanium dioxide;
   a Fabry-Perot cavity between the first and the second support layer, whereby the Fabry-Perot cavity is formed by providing an insulation layer on the first mirror structure, and at least partially removing the insulation layer after providing the second mirror structure; and
   electrodes for providing electrical contacts to the first and the second metal layer, the microelectromechanical (MEMS) Fabry-Perot interferometer further comprising
   a first aluminum oxide layer arranged below the transparent substrate; and
   a second aluminum oxide layer arranged above the transparent substrate, wherein the second aluminum oxide layer being part of the first support layer of the first metallic mirror structure,
   wherein the first metal layer of the first metallic mirror structure is arranged above the second aluminum oxide layer.

2. The microelectromechanical (MEMS) Fabry-Perot interferometer of claim 1, further comprising:
   a lower insulation layer arranged below the first aluminum oxide layer, wherein the lower insulation layer comprising tetraethyl orthosilicate.

3. The microelectromechanical (MEMS) Fabry-Perot interferometer of claim 1, further comprising:
   a third aluminum oxide layer arranged above the first metal layer, wherein the third aluminum oxide layer being part of the first support layer of the first metallic mirror structure.

4. The microelectromechanical (MEMS) Fabry-Perot interferometer of claim 3, further comprising:
   a first electric contact arranged to connect with the first metal layer, wherein a portion of the third aluminum oxide layer is removed between the first electric contact and the first metal layer by wet etching.

5. The microelectromechanical (MEMS) Fabry-Perot interferometer of claim 3, further comprising:
   the insulation layer arranged above the third aluminum oxide layer, wherein the insulation layer comprising tetraethyl orthosilicate.

6. The microelectromechanical (MEMS) Fabry-Perot interferometer of claim 5, further comprising:
   a fourth aluminum oxide layer arranged above the insulation layer, wherein the fourth aluminum oxide layer being part of the second support layer of the second metallic mirror structure.

7. The microelectromechanical (MEMS) Fabry-Perot interferometer of claim 6, wherein the second metal layer of the second metallic mirror structure is arranged above the fourth aluminum oxide layer.

8. The microelectromechanical (MEMS) Fabry-Perot interferometer of claim 7, further comprising:
   a fifth aluminum oxide layer arranged above the second metal layer, wherein the fifth aluminum oxide layer being part of the second support layer of the second metallic mirror structure.

9. The microelectromechanical (MEMS) Fabry-Perot interferometer of claim 8, further comprising:
   a second electric contact arranged to connect with the second metal layer, wherein a portion of the fifth aluminum oxide layer is removed between the second electric contact and the second metal layer by wet etching.

10. The microelectromechanical (MEMS) Fabry-Perot interferometer of claim 1, wherein the second metallic mirror structure comprises through-holes for removing at least part of the insulation layer to provide the Fabry-Perot cavity between the first and the second metallic mirror structure.

11. The microelectromechanical (MEMS) Fabry-Perot interferometer of claim 1, wherein
    the transparent substrate comprises fused quartz glass or fused silica glass;
    the aluminum oxide comprises $Al_2O_3$; and
    the titanium dioxide comprises $TiO_2$.

12. A semiconductor apparatus comprising a Fabry-Perot interferometer of claim 1.

13. A method for manufacturing a microelectromechanical (MEMS) Fabry-Perot interferometer, comprising:
    providing a transparent substrate;
    depositing a first metallic mirror structure on the transparent substrate, comprising a first metal layer and a first support layer;
    depositing a second metallic mirror structure above the first metallic mirror structure on opposite side of the first metallic mirror structure in view of the transparent substrate, the second metallic mirror structure comprising a second metal layer and a second support layer, wherein the first and the second support layer are parallel and comprising at least one of aluminum oxide or titanium dioxide;
    forming a Fabry-Perot cavity between the first and the second support layer, whereby the cavity is formed by providing an insulation layer on the first metallic mirror structure, and at least partially removing the insulation layer after providing the second metallic mirror structure;
    forming electrodes for providing electrical contacts to the first and the second metal layer;
    arranging a first aluminum oxide layer below the transparent substrate;
    arranging a second aluminum oxide layer above the transparent substrate, wherein the second aluminum oxide layer being part of the first support layer of the first metallic mirror structure; and
    arranging the first metal layer of the first metallic mirror structure above the second aluminum oxide layer.

* * * * *